(12) United States Patent
Nachumovsky et al.

(10) Patent No.: US 6,809,948 B2
(45) Date of Patent: Oct. 26, 2004

(54) MASK PROGRAMMABLE READ-ONLY MEMORY (ROM) CELL

(75) Inventors: Ishai Nachumovsky, Migdal Haemek (IL); Yaov Nissan-Cohen, Migdal Haemek (IL); Robert J. Strain, San Jose, CA (US)

(73) Assignee: Tower Semiconductor, Ltd., Migdal Haemek (IL)

( * ) Notice: Subject to any disclaimer, the term of this patent is extended or adjusted under 35 U.S.C. 154(b) by 0 days.

(21) Appl. No.: 10/430,931

(22) Filed: May 6, 2003

(65) Prior Publication Data

US 2003/0223291 A1 Dec. 4, 2003

Related U.S. Application Data

(62) Division of application No. 10/043,677, filed on Jan. 9, 2002, now Pat. No. 6,590,797.

(51) Int. Cl.[7] .............................................. G11C 17/00
(52) U.S. Cl. ....................... 365/96; 365/94; 365/225.7; 365/103; 365/104
(58) Field of Search ........................ 365/96, 94, 225.7, 365/103, 104

(56) References Cited

U.S. PATENT DOCUMENTS

| | | | |
|---|---|---|---|
| 3,271,591 A | 9/1966 | Ovshinsky | |
| 3,629,863 A | 12/1971 | Neale | |
| 3,675,090 A | 7/1972 | Neale | |
| 4,609,998 A | * 9/1986 | Bosnyak et al. | 365/96 |
| 5,166,758 A | 11/1992 | Ovshinsky et al. | |
| 5,233,217 A | 8/1993 | Dixit et al. | |
| 5,299,150 A | * 3/1994 | Galbraith et al. | 365/94 |
| 5,341,328 A | 8/1994 | Ovshinsky et al. | |
| 5,469,109 A | * 11/1995 | Paivinen | 327/525 |
| 5,886,392 A | 3/1999 | Schuegraf | |
| 5,936,832 A | 8/1999 | Saito et al. | |
| 6,154,054 A | 11/2000 | Shroff et al. | |

* cited by examiner

Primary Examiner—Connie C. Yoha
(74) Attorney, Agent, or Firm—Bever, Hoffman & Harms, LLP; E. Eric Hoffman

(57) ABSTRACT

A multi-bit programmable memory cell is provided that includes an access transistor and a plurality of N anti-fuse elements. The access transistor has a source coupled to a source line and a gate coupled to a word line. Each of the anti-fuse elements has a first terminal coupled to a drain of the access transistor, and a second terminal coupled to a corresponding bit line. At most, only one of the anti-fuse elements is programmed. The memory cell is capable of storing M bits, wherein $N=2^M-1$. A method is provided for both programming and reading the memory cell. In another embodiment, the anti-fuse elements can be replaced with mask-programmable elements.

2 Claims, 8 Drawing Sheets

MASK PROGRAMMABLE READ-ONLY MEMORY (ROM) CELL

RELATED APPLICATION

The present application is a divisional of commonly owned U.S. patent application Ser. No. 10/043,677, also entitled "MULTI-BIT PROGRAMMABLE MEMORY CELL HAVING MULTIPLE ANTI-FUSE ELEMENTS", by Ishai Nachumovsky, Yoav Nissan-Cohen and Robert J. Strain, filed Jan. 9, 2002 now U.S. Pat. No. 6,590,797, and is incorporated herein in its entirety by reference.

FIELD OF THE INVENTION

The present invention relates to a method for programming a memory cell by changing the state of a material, such as an anti-fuse element, in a MOS-based programmable memory. The present invention also relates to a multi-bit programmable memory cell that includes a plurality of anti-fuse elements.

RELATED ART

FIG. 1 is a cross sectional view of a conventional anti-fuse element 100, which includes first metal layer 101, second metal layer 102, inter-metal dielectric layer 103, metallic plug 104, and amorphous silicon layer 105. Metallic plug 104, which is located in a via in inter-metal dielectric layer 103, contacts first metal layer 101. Amorphous silicon layer 105 is located between metallic plug 104 and second metal layer 102. A titanium nitride barrier layer (not shown) may be located between amorphous silicon layer 105 and second metal layer 102. As deposited, amorphous silicon layer 105 is an insulator. However, after a sufficiently high voltage is applied across amorphous silicon layer 105, a conducting channel is formed in the amorphous silicon. For example, a voltage of about 5 Volts is sufficient to create a conducting channel in an amorphous silicon layer having a thickness of 100 Angstroms. The conducting channel created through layer 105 is permanent, with the resistance of this conducting channel being determined by the programming current. The relationship between the resistance (R) of the conducting channel and the programming current ($I_{PROGRAM}$) is defined as follows.

$$R = K_{FUSE}/I_{PROGRAM}.$$

The value of $K_{FUSE}$ is approximately 0.75. Thus, a programming current of 15 mA would result in a conducting channel having an on-resistance (R) of about 50 Ohms. As long as the subsequently applied currents are much smaller than the programming current (i.e., about 50 to 20 percent of the programming current or less), the on-resistance (R) will remain constant.

FIG. 2 is a circuit diagram of a conventional programmable read-only memory array 200 that uses anti-fuse elements. PROM array 200 includes PROM cells 201–208, word lines 211–212, source line 215 and bit lines 221–224. Each of PROM cells 201–208 includes a transistor and a corresponding anti-fuse element. Thus, PROM cells 201–208 include n-channel transistors 231–238 and anti-fuse elements 241–248, as illustrated. Although FIG. 2 illustrates a 2×4 array, it is understood that a typical PROM array will have a larger number of rows and columns.

Each of the PROM cells 201–208 can be programmed by applying a relatively large programming current through the anti-fuse element of the PROM cell. For example, a programming current can be applied to anti-fuse element 241 of PROM cell 201 by applying a high programming control voltage to word line 211 and a high programming voltage across bit line 221 and source line 215. The required programming current determines the required width of the corresponding transistor. Thus, if the anti-fuse elements are designed to be programmed in response to a programming current of 1 mA, then the width of the corresponding transistors must be sized to handle this 1 mA programming current. For example, a transistor having a 0.24 micron gate length is capable of handling 590 microAmps of current for each micron of width under nominal 2.5 Volt saturation conditions. Such a transistor must have a channel width of 1.7 microns to handle a 1 mA programming current. Using conventional 0.18 micron design rules, the resulting PROM cell will have a width of about 1.92 microns and a length of about 1.08 microns, or about 2.07 microns/bit. In contrast, a transistor designed at the design rule minimum using a 0.18 micron process is capable of handling a current of about 225 microAmps, and has a cell size of about 0.6 microns wide by about 1.08 microns long.

Alternative materials, such as mixed chalcogenides, have also been used as an anti-fuse material. Examples of mixed chalcogenides are described in U.S. Pat. No. 3,271,591 (Ovshinsky, 1966), U.S. Pat. No. 3,675,090 (Neale, 1972) and U.S. Pat. No. 5,166,758 (Ovshinsky, et al., 1991).

If the anti-fuse material characteristics or the circuit requirements dictate a programming current that is larger than the capability of a minimum sized device, it would be desirable to have a way of increasing the programming current without a commensurate increase in the memory cell size.

SUMMARY

Accordingly, the present invention provides a multi-bit memory cell that includes an access transistor and a plurality of N anti-fuse elements (where N is an integer greater than 1). The access transistor has a source coupled to a source line and a gate coupled to a word line. Each of the anti-fuse elements has a first terminal coupled to a drain of the access transistor, and a second terminal coupled to a corresponding bit line. Initially, all of the N anti-fuse elements are unprogrammed (open). At most, one of the N anti-fuse elements is programmed. Thus, the programmable memory cell is capable of storing (N+1) states. Consequently, the memory cell is cable of storing M binary bits, where $2^M = N+1$. For example, a memory cell that uses three anti-fuse elements (N=3) is capable of storing 2 binary bits.

The access transistor is sized to provide a programming current sufficient to program any one of the N anti-fuse elements. For example, the access transistor may be sized to provide a drive current of 1 mA. In this example, the memory cell of the present invention would have a similar layout area as a conventional PROM cell. However, the memory cell of the present invention (which stores M bits) would have a per bit area that is M times less than the per bit area of a conventional PROM cell. In one embodiment, the multi-bit memory cell of the present invention is implemented in an array. In a particular embodiment, this array can have in excess of 100,000 transistors, organized into rows accessed by word lines and columns connected by bit lines.

Another embodiment includes a method for operating the multi-bit programmable memory cell, which includes (1) programming one or none of the N anti-fuse elements of the memory cell, (2) applying a read voltage to a first terminal of each of the N anti-fuse elements through the access transistor, (3) sensing the signals on the second terminals of the N anti-fuse elements while the read voltage is applied to the first terminals, and (4) decoding the signals sensed on the second terminals of the N anti-fuse elements, thereby providing M decoded data signals.

The present invention will be more fully understood in view of the following description and drawings.

DETAILED DESCRIPTION

Figure 1:
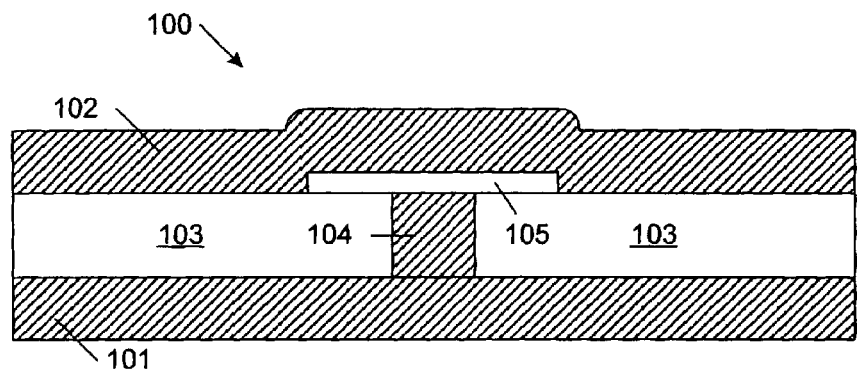
FIG. 1 is a cross sectional view of a conventional anti-fuse element.
Figure 2:
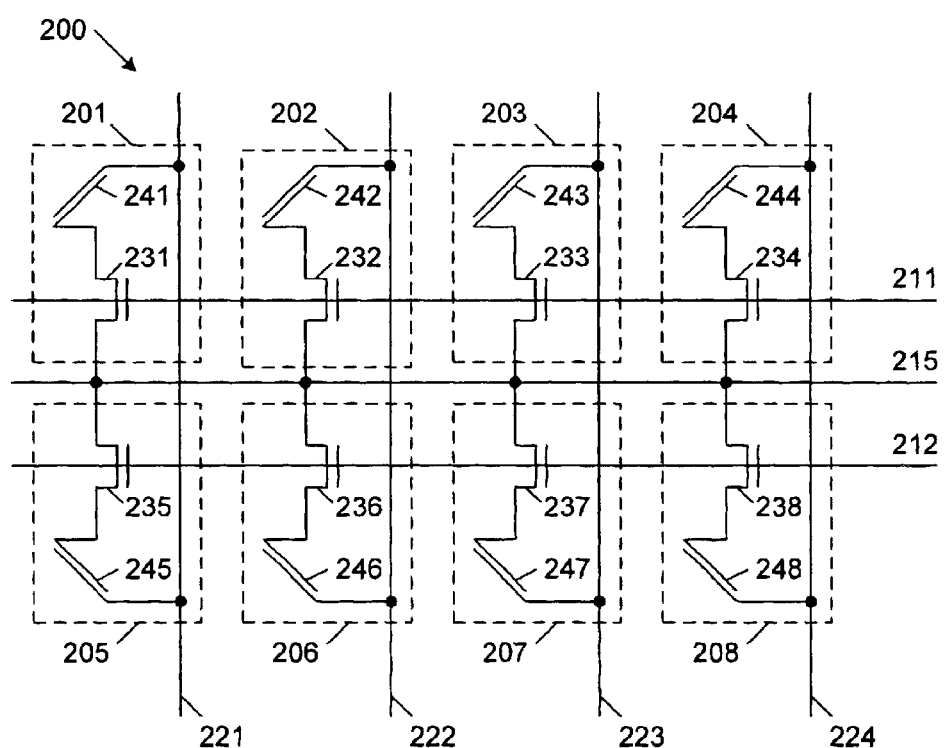
FIG. 2 is a circuit diagram of a conventional programmable read-only memory array that uses one anti-fuse element per PROM cell.
Figure 3:
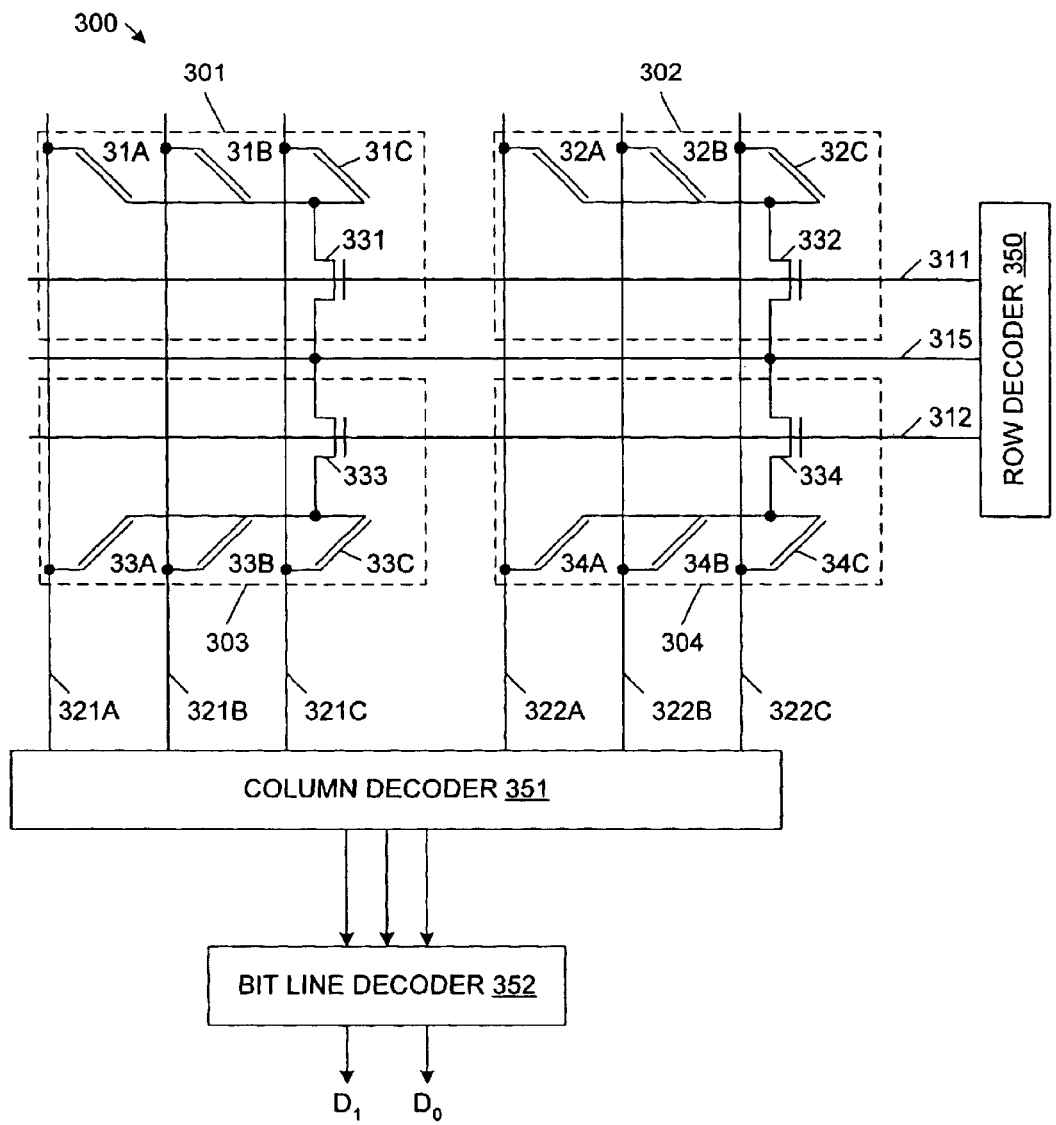
FIG. 3 is a circuit diagram of a programmable read-only memory array that uses multiple anti-fuse elements per access transistor in accordance with one embodiment of the present invention.

FIG. 3 is a circuit diagram of a programmable read-only memory array 300 that uses multiple anti-fuse elements per transistor in accordance with one embodiment of the present invention. More specifically, PROM array 300 includes PROM cells 301–304, word lines 311–312, common source line 315, bit lines 321A–321C and 322A–322C, row decoder 350, column decoder 351 and bit line decoder 352. Each of PROM cells 301–304 includes an access transistor and three anti-fuse elements. More specifically, PROM cells 301–304 include access transistors 331–334, respectively, and anti-fuse elements 31A–31C, 32A–32C, 33A–33C and 34A–34C, respectively. Each of access transistors 331–334 is an n-channel MOS transistor having a source coupled to source line 315. The gates of access transistors 331 and 332 are coupled to word line 311. Similarly, the gates of access transistors 333 and 334 are coupled to word line 312. The drains of each of transistors 331–334 are coupled to the anti-fuse elements in the corresponding PROM cell. For example, the drain of transistor 331 is coupled to each of anti-fuse elements 31A–31C. Each of the three anti-fuse elements in each PROM cell are also coupled to a corresponding bit line. For example, anti-fuse elements 31A–31C (and anti-fuse elements 33A–33C) are coupled to bit lines 321A–321C, respectively. Row decoder 350 is coupled to word lines 311–312 and source line 315. Column decoder 351 is coupled to bit lines 321A–321C and 322A–322C. Column decoder 351 selectively couples one set of three bit lines to bit line decoder 352. As described in more detail below, bit line decoder 352 provides a 2-bit output data value $D_1$–$D_0$ in response to the received bit line signals.

Although PROM array 300 is shown as a 2×2 array of PROM cells 301–304, it is understood that arrays of other sizes can be implemented in accordance with other embodiments of the invention. For example, a megabit PROM might have 1024 rows and 512 columns of access transistors. In such an embodiment, a common source line could be coupled to all of the access transistors in the array. Alternately, each two rows of access transistors could share a common source line in the manner illustrated in FIG. 3.

Figure 4B:
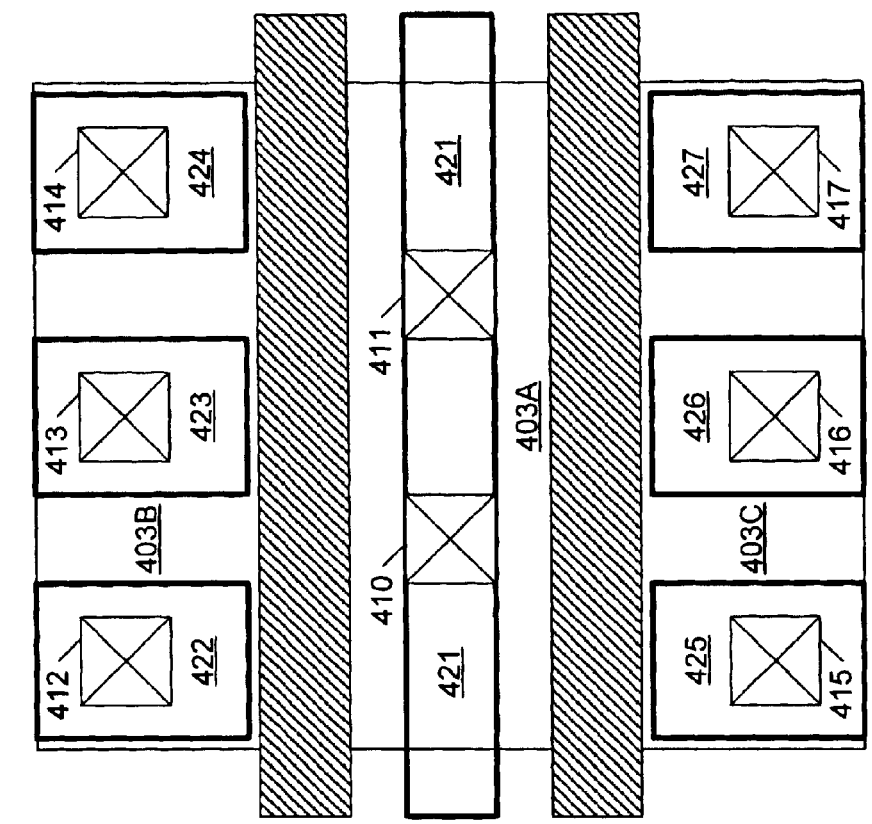
FIGS. 4A–4E are diagrams illustrating the layout of a pair of PROM cells in accordance with one embodiment of the present invention.
Figure 4A:
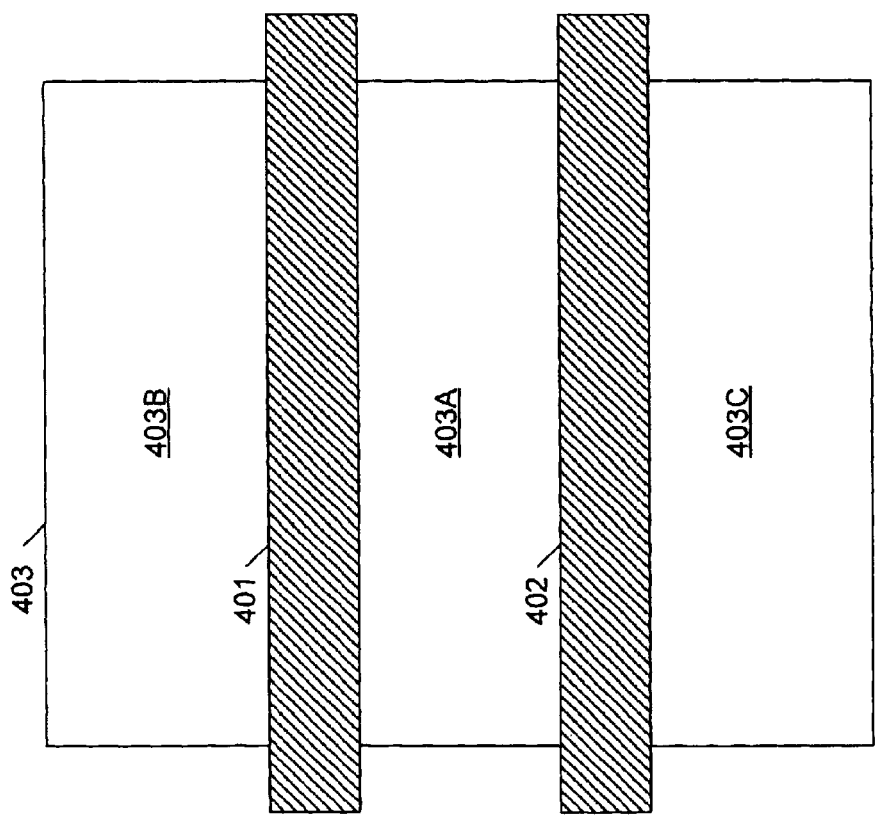

FIGS. 4A–4E are diagrams illustrating the layout of PROM cells 301 and 303 in accordance with one embodiment of the present invention. As illustrated in FIG. 4A, polysilicon gate electrodes 401 and 402 are located over active region 403, which is defined by field oxide. Active region 403 is originally a p-type semiconductor region, such as a p-well. However, n-type dopant is introduced into active region 403, with polysilicon gate electrodes 401 and 402 (and the field oxide) being used as a mask. As result, the exposed portions of active region 403 become n-type semiconductor regions 403A–403C, while portions of active region 403 underlying polysilicon gate electrodes 401 and 402 remain p-type semiconductor regions (i.e., channel regions). Polysilicon gate electrodes 401 and 402 form the gate electrodes of access transistors 301 and 303, respectively. N-type region 403A forms the source regions of transistors 331 and 333, n-type region 403B forms the drain region of transistor 331, and n-type region 403C forms the drain region of transistor 333.

FIG. 4B illustrates the formation of the first metal layer and the contacts between the first metal layer and the underlying substrate. More specifically, FIG. 4B illustrates contacts 410–417 and first metal layer structures 421–427. First metal line 421, which contacts source region 403A via contacts 410 and 411, forms source line 315 (FIG. 3). First metal structures 422–424, which contact drain region 403B via contacts 422–424, form the lower metal layers of anti-fuse elements 31A–31C, respectively (FIG. 3). First metal structures 425–427, which contact drain region 403B via contacts 425–427, form the lower metal layers of anti-fuse elements 33A–33C, respectively (FIG. 3).

Figure 4D:
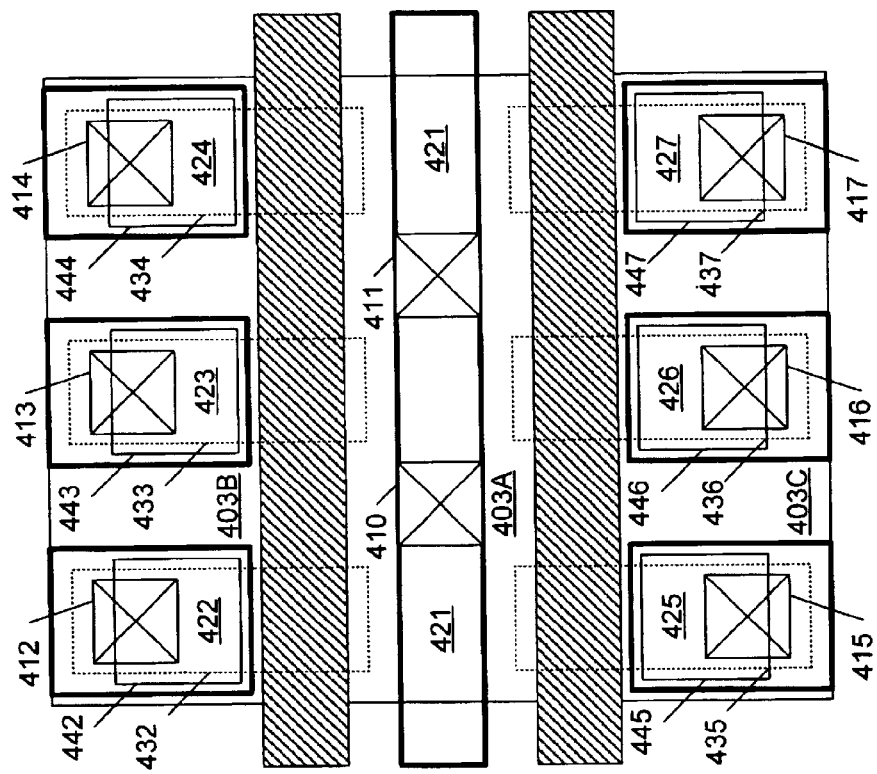
Figure 4C:
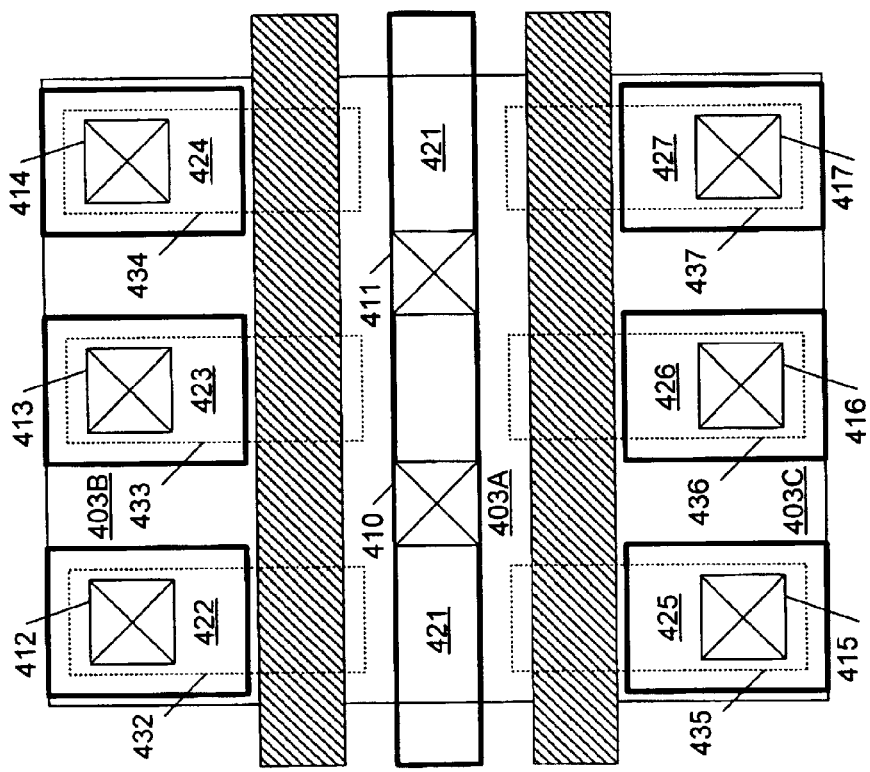

FIG. 4C illustrates the formation of an intermediate metal structure, which contacts the underlying first metal layer. The intermediate metal structure includes intermediate metal structures 432–437, which are shown in short dashed lines, and contact underlying first metal structures 422–427, respectively.

FIG. 4D illustrates the formation of a top conductive plug layer, which contacts the underlying intermediate metal structure. The top conductive plug layer includes conductive plugs 442–447, which contact underlying intermediate metal structures 432–437, respectively. An amorphous silicon anti-fuse layer (not shown) is formed over the top plug layer. However, this anti-fuse layer is not patterned at the bit level. Because the anti-fuse layer is normally very highly resistive, the patterning of this layer is not critical. However, the anti-fuse layer cannot be included over other circuitry. The patterning of anti-fuse layer can be done to cover the major blocks of the memory array. However, the amorphous silicon is removed (typically by reactive ion etching) from the memory row and column selection circuitry, from the sensing and decode circuitry, and from all of the circuitry outside of the PROM. The amorphous silicon can be patterned on a row-by-row basis with little loss of density. However, patterning the anti-fuse layer on a bit-by-bit basis might compromise the density of the array.

Figure 4E:
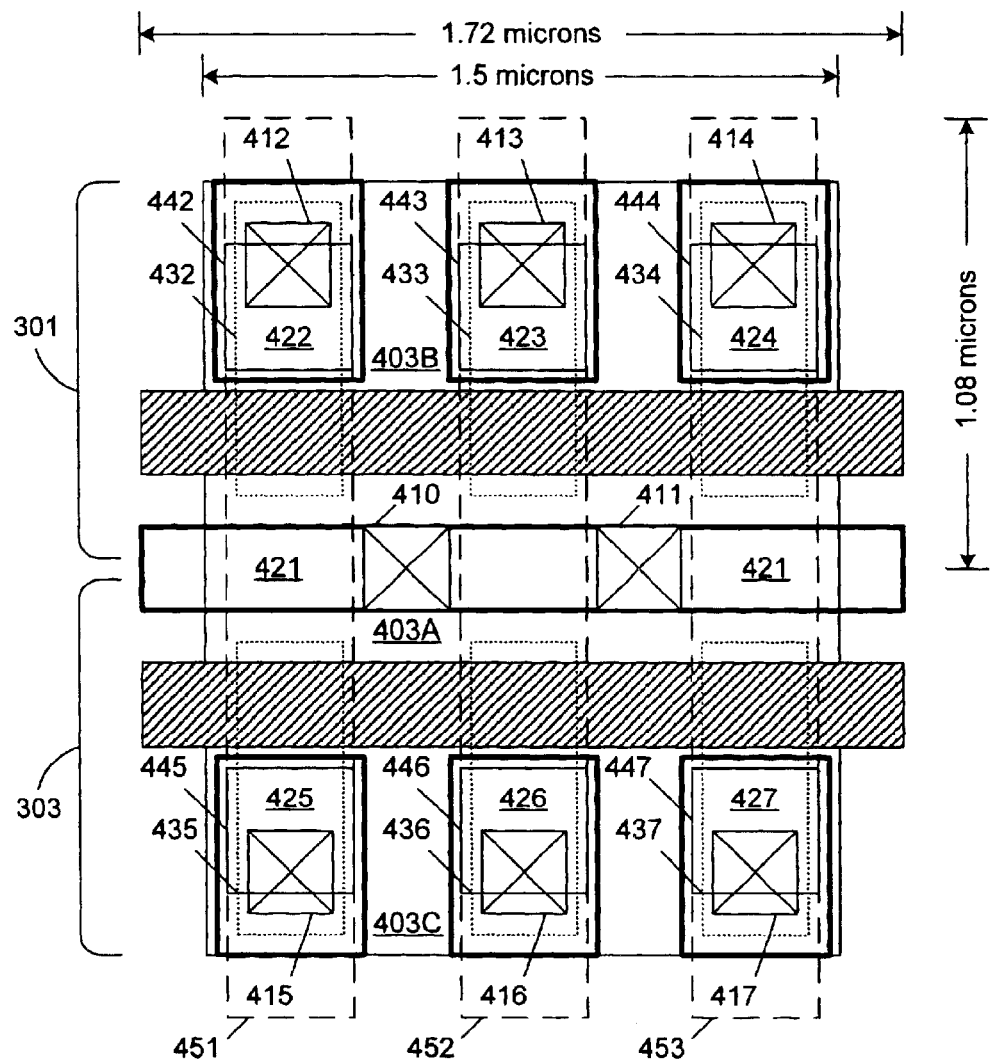

FIG. 4E illustrates the formation of a top metal layer, which includes a plurality of bit lines 451–453, which correspond with bit lines 321A–321C, respectively. Bit line 451 extends over the anti-fuse layer and the underlying conductive plugs 442 and 445. Bit line 452 extends over the anti-fuse layer and the underlying conductive plugs 443 and 446. Bit line 453 extends over the anti-fuse layer and the underlying conductive plugs 444 and 447.

In the described embodiment, each of transistors 331–334 has a channel width of about 1.5 microns, allowing each of these transistors to exhibit a nominal drive current of about 900 micro-Amps. This drive current is available to any one of the three anti-fuse elements attached to each transistor. Allowing for nominal spacing between active regions in a 0.18 micron process, each of PROM cells 301–304 has a total width of about 1.72 microns and a total height of about 1.08 microns. These dimensions are illustrated in FIG. 4E. Thus, in the described embodiment, each of PROM cells 301–304 has a layout area of about 1.86 microns$^2$. It is important to note that the dimensions and current levels defined in the present example are illustrative, but not limiting. This example shows the advantages gained by the present invention, particularly in terms of the current available to each fusing element. However, the gains would be similar in any MOS technology.

In order to increase the drive current of each of transistors 331–334 to 1 mA, the entire cell structure is increased in width by 0.2 microns. In this case, each of PROM cells 301–304 would have a total width of 1.92 microns and a total height of about 1.08 microns, for a total area of about 2.07 microns$^2$. Thus, to provide a drive current of 1 mA, each of PROM cells 301–304 will have the same size as the conventional PROM cell described above. However, as described below, the PROM cell of the present invention supports two bits, in contrast to the one bit supported by the conventional PROM cell described above. Consequently, the bit density is doubled, and the effective area per bit is about 1.04 square microns. At the reduced drive current of 900 microAmps, the effective area per bit is 0.93 square microns.

PROM array 300 operates as follows. Initially, all of the anti-fuse elements 31A–31C, 32A–32C, 33A–33C and 34A–34C are in an unprogrammed (open) state. One or none of the anti-fuse elements in each of the PROM cells 301–304 is subsequently programmed to a conductive state. As described in more detail below, this programming allows each of PROM cells 301–304 to store 2-bits of data.

Anti-fuse element 31A of PROM cell 301 is programmed as follows. Although the programming of PROM cell 301 is described, it is understood that PROM cells 302–304 are programmed in a similar manner. Source line 315 is held at a ground supply voltage (0 Volts) and a first programming voltage of about 2.5 Volts is applied to word line 311. A second programming voltage of about 6 Volts is applied to bit line 321A, and the other two non-selected bit lines 321B and 321C are allowed to float, or are held at the ground supply voltage. The word lines of non-selected rows (e.g., word line 312) are held at the same voltage as source line 315 (i.e., 0 Volts). Under these conditions, a programming current of approximately 900 microAmps or 1 mA, depending on the size of PROM cell 301, flows through access transistor 331 and anti-fuse element 31A, thereby creating a conducting channel in anti-fuse element 31A. In the present example, the anti-fuse elements 31A–31C, which are constructed from amorphous silicon are one-time programmable.

Each of PROM cells 301–304 stores 2-bits of data by encoding the anti-fuse elements of each of the PROM cells in an appropriate manner. In this encoding scheme, it is essential that for each access transistor, no more than a single corresponding anti-fuse element is programmed to a conductive state. Thus, the data is encoded in a non-traditional manner. Since no more than a single anti-fuse element in each PROM cell can be programmed to a conducting the anti-fuses (i.e., bit lines) must be encoded. In the present example, the encoding provides two bits per transistor, with the three anti-fuse elements 31A–31C of PROM cell 301 encoded as defined below in Table 1. PROM cells 302–304 are encoded in the same manner as PROM cell 301.

TABLE 1

| State | Anti-Fuse 31A | Anti-Fuse 31B | Anti-Fuse 31C | Bit $D_1$ | Bit $D_0$ |
|---|---|---|---|---|---|
| 0 | Open | Open | Open | 0 | 0 |
| 1 | Conductive | Open | Open | 0 | 1 |
| 2 | Open | Conductive | Open | 1 | 0 |
| 3 | Open | Open | Conductive | 1 | 1 |

Thus, by programming anti-fuse element 31A, PROM cell 301 stores a first data bit $D_0$ having a logic "1" value, and a second data bit $D_1$ having a logic "0" value. In an alternate embodiment, a PROM cell having a single access transistor coupled to seven anti-fuse elements can be used to store 3-bits of data. However, the PROM cell configuration of FIG. 3 supports relatively simple encoding and decoding.

The 2-bits stored in PROM cell 301 are simultaneously read in the following manner. First, row decoder 350 decodes a read address to determine that the PROM cell 301 being accessed is located in the first row of array. 300. Row decoder 350 applies the ground supply voltage (0 Volts) to source line 315 and non-selected word line 312, and a first read voltage of about 1.2 to 2.5 Volts to the word line 311 corresponding with the addressed row of array 300. Under these conditions, access transistors 331 and 332 in the first row of array 300 are turned on. Read voltages corresponding with the programmed/non-programmed states of anti-fuse elements 31A–31C and 32A–32C are developed on bit lines 321A–321C and 322A–322C, respectively. In the described example, bit line 321A is pulled down to ground through programmed anti-fuse element 31A, such that a read current flows on bit line 321A. No significant read current flows through unprogrammed anti-fuse elements 31B–31C or 32A–32C. In an alternate embodiment, the bit lines are pre-charged to a voltage between 1.2 and 3 Volts at the beginning of a read operation, wherein the voltage on a bit line coupled to a programmed anti-fuse element would drop rapidly below the pre-charge value during the read operation. In this alternate embodiment, the bit lines are monitored by a clocked sense amplifier.

The read address is further decoded by column decoder 351 to determine that the first column of array 300 is being read. In response, column decoder 351 selectively couples the three bit lines 321A–321C of the first column of array 300 to bit line decoder 352. Bit line decoder 352 senses and amplifies any read voltages present on bit lines 321A–321C. In the present example, bit line decoder 352 will sense a read voltage on bit line 321A as a result of the programmed anti-fuse element 31A. Bit line decoder 352 decodes the read voltage (or lack thereof) on bit lines 321A–321C in accordance with the encoding system set forth above in Table 1, such that bit line decoder 352 identifies a corresponding 2-bit data value $D_1$–$D_0$. An output buffer within bit line decoder 352 then drives the 2-bit data value $D_1$–$D_0$ to an external circuit. Because PROM arrays normally have wide output buses (e.g., 8-bits, 16-bits or 32-bits), the fact that data is read from array 300 2-bits at a time is largely irrelevant.

In an alternate embodiment, the bit line sensing may be performed before column decoding. However, this alternate embodiment is less power efficient than the above described embodiment.

Figure 5:
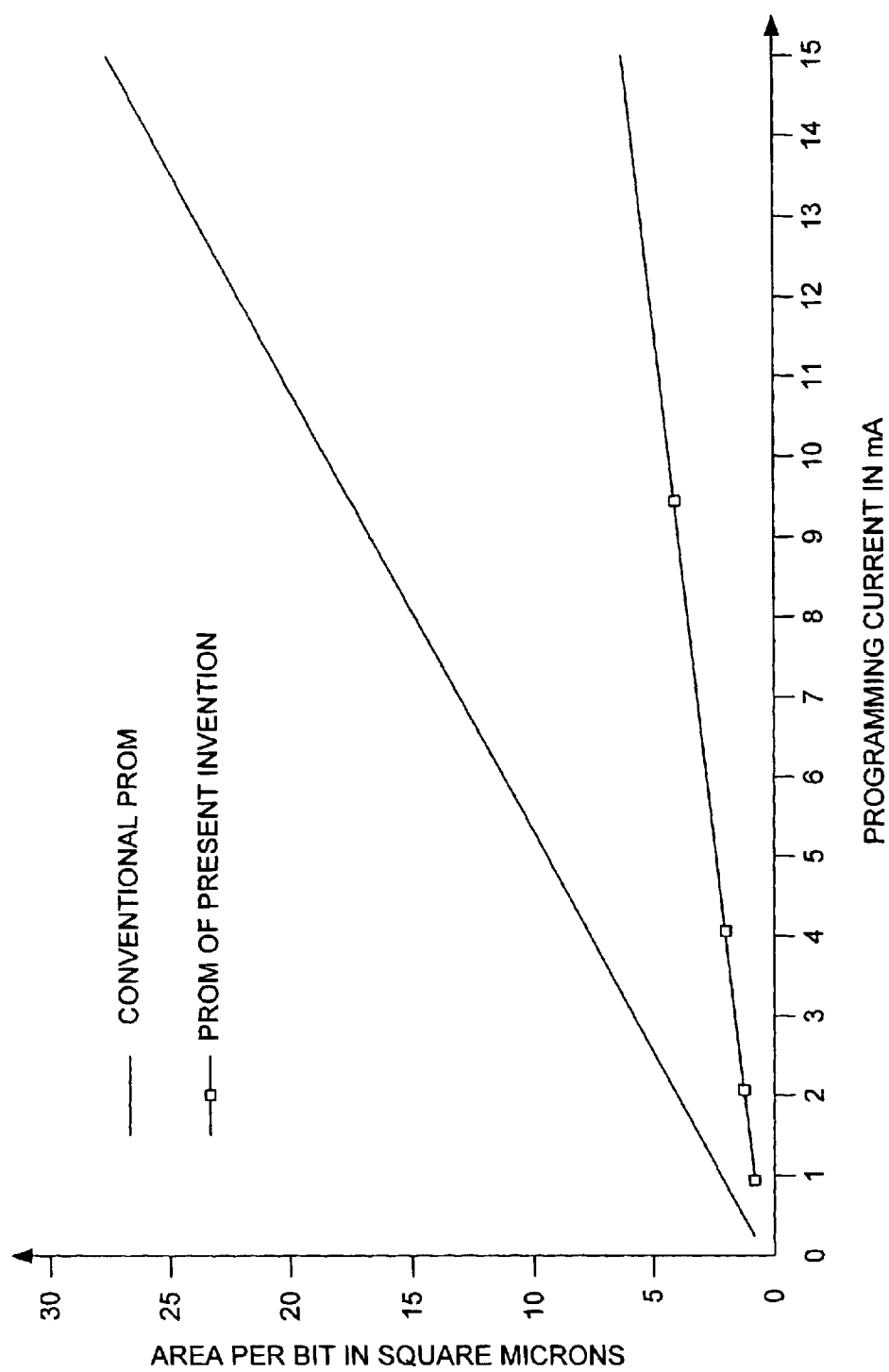
FIG. 5 is a graph illustrating the required area per bit versus programming current for both conventional PROM cells and the PROM cells in accordance with the present invention.

In addition, other coding schemes are possible. The schemes based on powers of two are the most efficient. The baseline example uses three bit lines to realize four states, or two bits. This can be generalized as follows.

$$N_{LINES}=2^M-1$$

Where $N_{LINES}$ is equal to the number of bit lines per PROM cell, and M is equal to the number of bits represented by the PROM cell. Thus, a PROM cell capable of storing 3-bits requires 7 bit lines, a PROM cell capable of storing 4-bits requires 15 bit lines. Using more lines per transistor is normally done only in a case where wider transistors are required to handle a higher programming current. This might be driven by a different choice of materials, or by some limitation in the processing of amorphous silicon. In every case, there is an advantage in drive current per bit area. FIG. 5 is a graph illustrating the required area per bit versus programming current for both conventional PROM cells and the PROM cells in accordance with the present invention.

Figure 6:
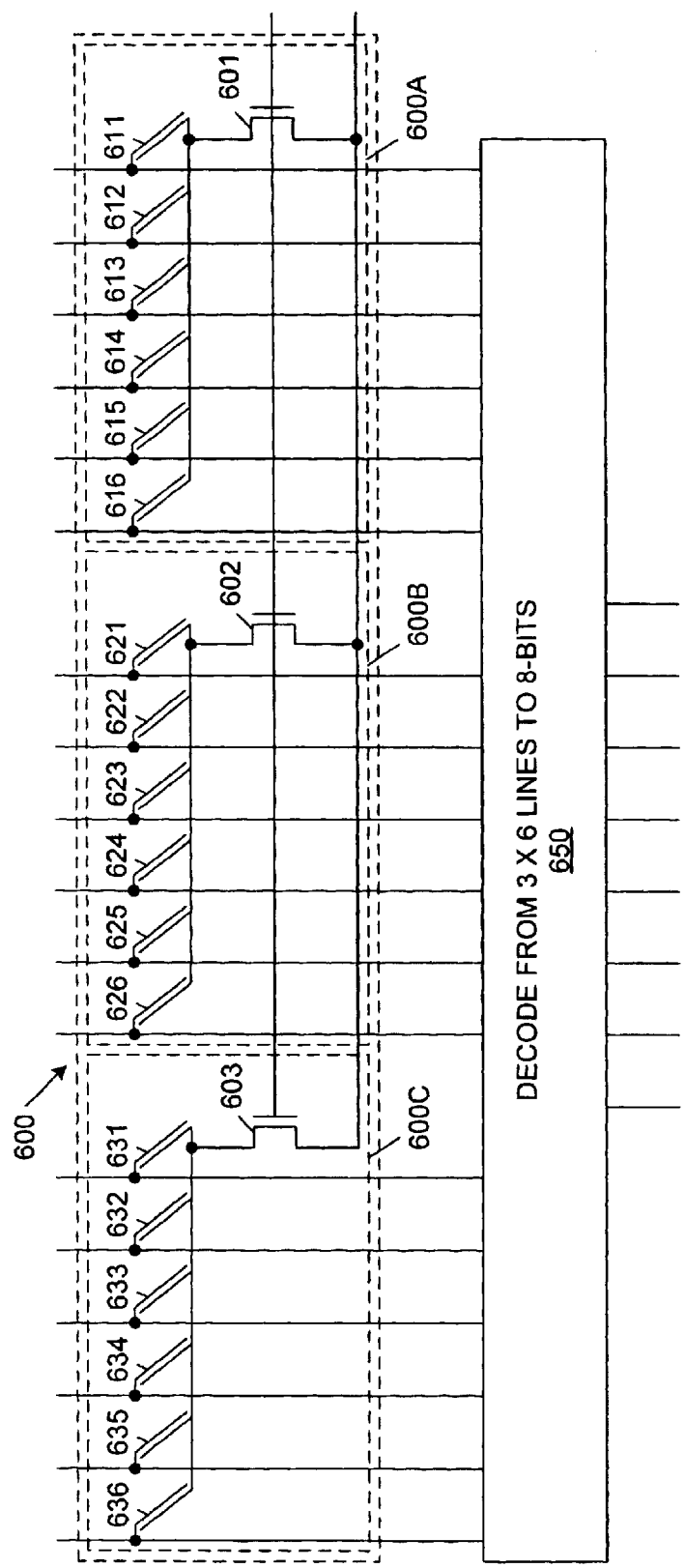
FIG. 6 is a circuit diagram of an 8-bit PROM cell made up of three smaller PROM cell structures in accordance with another embodiment of the present invention.

Alternative coding methods can be used, but are less efficient. For example, FIG. 6 is a circuit diagram of an 8-bit PROM cell 600 made up of three smaller PROM cell structures 600A, 600B and 600C. PROM cell structure 600A, 600B and 600C include access transistors 601, 602 and 603, respectively, and anti-fuse elements 611–616, 621–626 and 631–636, respectively. Each of the PROM cell structures 600A–600C has six bit lines, and supports a total of 7 states. These three PROM cell structures 600A–600C will therefore support a total of 7×7×7 or 343 states. The 18 (3×6) bit lines are provided to decoder 650, which decodes the 343 available states to 8-bits, using 256 of the possible states. In this manner, the three PROM cell structures 600A, 600B and 600C can be decoded into an 8-bit data value (256 states). In an array there would be a multiplicity of decoders similar to decoder 650. These decoders can be located either before or after the column decoders. Coding schemes involving multiple transistors are more complex, but there may be design considerations that make such structures desirable.

It is possible that there might be applications where a design and the corresponding software have become stable, and it is desired to eliminate programming from the manufacturing cycle. That is, it may be desirable to make the cell mask-programmable. This is readily done by eliminating the amorphous silicon from the process and preparing a via mask to eliminate all conductive plugs (e.g., plugs 442–447 in FIG. 4E), except for the conductive plugs where it is desired to have the element in a conductive (programmed) state. The practical advantage of this is that production costs can be reduced for products after they reach high volume, with minimum expense in terms of design, mask making and product qualification.

In yet another embodiment, a state may be added to identify whether a memory cell has been programmed or not. In this embodiment, a cell supporting M bits will have a total of 2×M bit lines (and programmable links). For example, a cell representing two bits would have four bit lines and four corresponding programmable elements.

Figure 7:
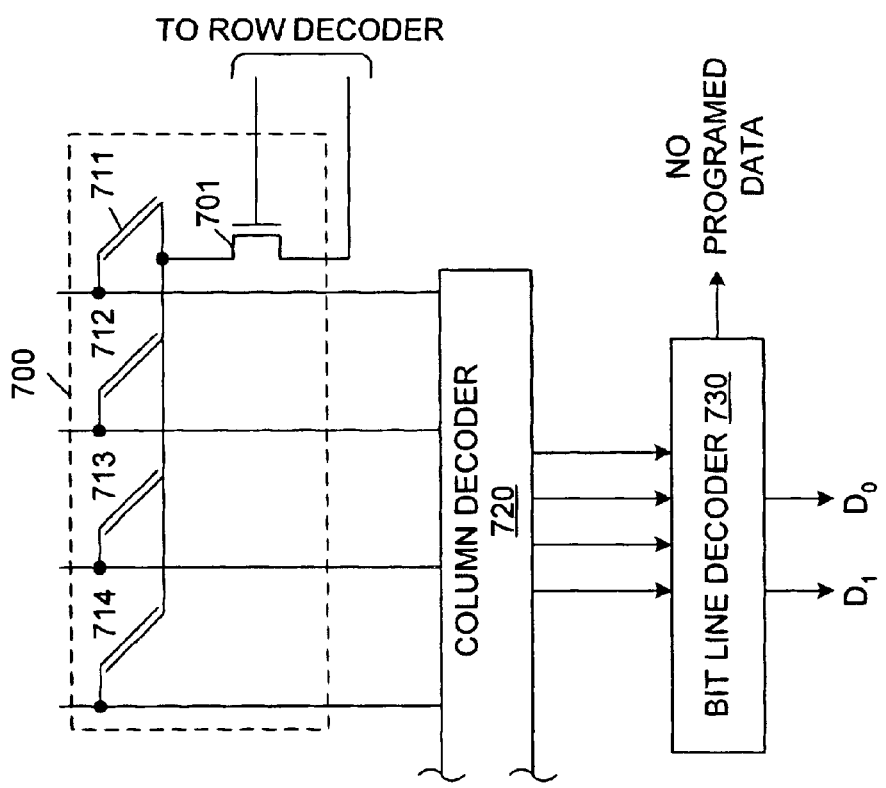
FIG. 7 is a circuit diagram of a 2-bit PROM cell that accommodates a non-programmed state in accordance with one embodiment of the present invention.

Consequently, this cell would have a total of five possible states. In this case, the fifth state is a null state, indicating that the cell has never been programmed. FIG. 7 is a circuit diagram of a memory cell 700 having such a configuration. Memory cell 700, which is part of a larger array (not shown), includes access transistor 701 and anti-fuse devices 711, 712, 713 and 714. Access transistor 701 is coupled to a row decoder in the manner illustrated in FIG. 3. The bit lines coupled to anti-fuse devices 711–714 are provided to column decoder 720. If memory cell 700 is selected, these bit lines are coupled to bit line decoder 730. Bit line decoder 730 decodes the bit lines of memory cell 700 in the manner defined by Table 2 in accordance with one embodiment of the present invention. Note that in Table 2, the "not programmed" state is identified by "NP".

TABLE 2

| State | Anti-fuse 711 | Anti-fuse 712 | Anti-fuse 713 | Anti-fuse 714 | Bit $D_1$ | Bit $D_0$ |
|---|---|---|---|---|---|---|
| Null | Open | Open | Open | Open | NP | NP |
| 0 | Conductive | Open | Open | Open | 0 | 0 |
| 1 | Open | Conductive | Open | Open | 0 | 1 |
| 2 | Open | Open | Conductive | Open | 1 | 0 |
| 3 | Open | Open | Open | Conductive | 1 | 1 |

Although the present invention has been described with amorphous silicon as the anti-fuse layer, other anti-fuse layers, such as silicon oxide and mixtures of semiconductor compounds (such as those commonly available from Energy Conversion Devices, Inc.), can also be used. As long as the fusing current represents a significant part of the array design, the principles of the present invention are applicable.

Figure 8:
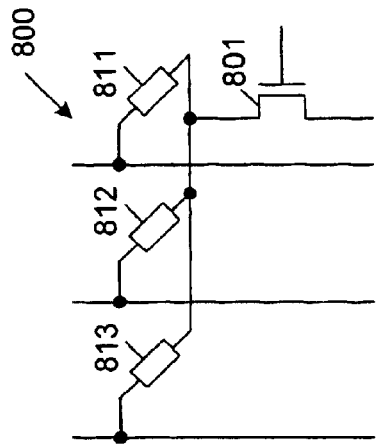
FIG. 8 is a circuit diagram of a programmable memory cell that uses electrical programmable and erasable elements in accordance with another embodiment of the present invention.

FIG. 8 illustrates the use of an alternate anti-fuse in accordance with one embodiment of the present invention. More specifically, FIG. 8 is a circuit diagram of a memory cell 800, which includes access transistor 801 and electrically programmable and erasable anti-fuse elements 811–813. Memory cell 800 is similar to memory cell 301 (FIG. 3). However, the anti-fuses 31A–31C of memory cell 301 are replaced with electrically programmable and erasable anti-fuse elements 811–813 in memory cell 800. Electrically programmable and erasable anti-fuse elements 811–813 differ from anti-fuses in that these elements can be electrically programmed and erased more than once. Electrically programmable and erasable anti-fuse elements 811–813 can include materials such as glassy mixed chalcogenides, which take on a highly conductive state or a highly resistive state according to the thermal cycle applied during programming. To the extent that the performance of memory cell 800 is enhanced by the availability of high programming currents, the present invention serves to increase the available programming current without a commensurate increase in the area of each bit. In the described embodiment, memory cell 800 is subject to an on-going restriction that not more than one of electrically programmable and erasable anti-fuse elements 811–813 can be conductive at any give time. Thus, it is necessary to erase (i.e., make insulating) all of elements 811–813, before programming memory cell 800 by making a single selected one of elements 811–813 conductive. Thus, the memory cell 800 must be initially manufactured such that the electrically programmable and erasable anti-fuse elements 811–813 are initially in a non-conducting state.

It is important to note that an underlying premise of the present invention is to make more current available for changing the state of a material in an MOS based programmable memory.

Although the invention has been described in connection with several embodiments, it is understood that this invention is not limited to the embodiments disclosed, but is capable of various modifications, which would be apparent to a person skilled in the art. For example, although the present invention describes the accessing of a single programmable memory cell during a program or read operation, it is understood that more than one programmable memory cell can be accessed in parallel during a program or read operation. Moreover, although the invention has been described in connection with an n-channel access transistor, it is understood that the described conductivity types can be reversed to provide a p-channel access transistor. Thus, the invention is limited only by the following claims.

What is claimed is:

1. A mask programmable read-only memory (ROM) cell comprising:

an access transistor having a source coupled to a source line, a gate coupled to a word line, and a drain;

a plurality of bit lines associated with the access transistor; and a pattern of conductive and non-conductive regions located between the bit lines and the drain of the access transistor, wherein the pattern of conductive and non-conductive regions are mask programmed, and, wherein each conductive region couples the drain of the access transistor to one of the bit lines, and each non-conductive region isolates the drain of the access transistor from one of the bit lines.

2. The mask programmable ROM cell of claim 1, wherein at most, one conductive region couples the drain of the-access transistor to one of the bit lines.

* * * * *